(12) United States Patent
Jung (10) Patent No.: US 7,177,185 B2
(45) Date of Patent: Feb. 13, 2007

(54) NON-VOLATILE FLASH MEMORY DEVICE HAVING DUAL-BIT FLOATING GATE

(75) Inventor: Jin Hyo Jung, Bucheon-si (KR)

(73) Assignee: Dongbu Electronics Co., Ltd., Seoul (KR)

(*) Notice: Subject to any disclaimer, the term of this patent is extended or adjusted under 35 U.S.C. 154(b) by 0 days.

(21) Appl. No.: 11/023,425

(22) Filed: Dec. 29, 2004

(65) Prior Publication Data

US 2005/0162884 A1   Jul. 28, 2005

(30) Foreign Application Priority Data

Dec. 31, 2003   (KR) .................. 10-2003-0101080

(51) Int. Cl.
G11C 11/34   (2006.01)
(52) U.S. Cl. .................. 365/185.03; 365/185.24; 365/185.33
(58) Field of Classification Search ............ 365/104, 365/185.03, 185.26, 185.28, 185.3, 185.01, 365/185.24, 185.29, 185.33
See application file for complete search history.

(56) References Cited

U.S. PATENT DOCUMENTS

| | | | | |
|---|---|---|---|---|
| 5,364,806 A | * | 11/1994 | Ma et al. .................. | 438/266 |
| 5,422,292 A | * | 6/1995 | Hong et al. .................. | 438/261 |
| 5,654,917 A | * | 8/1997 | Ogura et al. ............ | 365/185.18 |
| 5,877,523 A | * | 3/1999 | Liang et al. ................. | 257/315 |
| 6,093,945 A | * | 7/2000 | Yang ......................... | 257/317 |
| 6,097,059 A | * | 8/2000 | Yamada ....................... | 257/321 |
| 6,197,639 B1 | | 3/2001 | Lee et al. | |
| 6,204,530 B1 | * | 3/2001 | Choi ........................... | 257/315 |
| 6,243,289 B1 | * | 6/2001 | Gonzalez et al. ....... | 365/185.03 |
| 6,359,807 B1 | * | 3/2002 | Ogura et al. ............ | 365/185.18 |
| 6,462,375 B1 | * | 10/2002 | Wu ............................. | 257/316 |
| 6,479,858 B2 | * | 11/2002 | Krivokapic ................. | 257/314 |
| 6,573,557 B1 | | 6/2003 | Watanabe | |
| 6,586,349 B1 | * | 7/2003 | Jeon et al. ................... | 438/785 |
| 6,635,532 B2 | | 10/2003 | Song et al. | |
| 6,649,470 B2 | | 11/2003 | Gonzalez et al. | |

(Continued)

OTHER PUBLICATIONS

Wilk et al. High-k dielectrics: Current status and materials properties considerations. May 15, 2001. Journal of Applied Physics: vol. 89, No. 10 (pp. 5243-5275).*

*Primary Examiner*—Anh Phung
*Assistant Examiner*—Alexander Sofocleous
(74) *Attorney, Agent, or Firm*—Finnegan, Henderson, Farabow, Garrett, & Dunner, L.L.P.

(57) ABSTRACT

A non-volatile memory device having a unit cell, the unit cell including a transistor, word lines, a first bit line and a second bit line. The transistor includes a gate oxide layer on a substrate, polysilicon gate, sidewall floating gates, block oxide layers formed between the polysilicon gate and sidewall floating gates, the block oxide layers also comprising first block oxide layer and second block oxide layer, and source and drain regions. The word lines are vertically placed on the substrate and connected to the polysilicon gate. The first bit line is orthogonally placed to the word lines and connected to the source region and a second bit line is orthogonally placed to the word lines and connected to the drain region.

7 Claims, 6 Drawing Sheets

U.S. PATENT DOCUMENTS

| | | | |
|---|---|---|---|
| 6,706,599 B1 * | 3/2004 | Sadd et al. | 438/261 |
| 6,798,012 B1 * | 9/2004 | Ma et al. | 257/315 |
| 2003/0080372 A1 * | 5/2003 | Mikolajick | 257/315 |
| 2005/0139897 A1 * | 6/2005 | Jung | 257/315 |
| 2005/0142751 A1 * | 6/2005 | Jung | 438/257 |
| 2005/0151204 A1 * | 7/2005 | Jung | 257/377 |

* cited by examiner

NON-VOLATILE FLASH MEMORY DEVICE HAVING DUAL-BIT FLOATING GATE

BACKGROUND OF THE INVENTION

1. Field of the Invention

The present disclosure relates generally to a semiconductor fabrication and, more particularly, to a non-volatile memory device having sidewall floating gates which can control two bits with just one transistor.

2. Background of the Related Art

In general, there are two categories in a semiconductor device, namely, a volatile memory and a non-volatile memory. The volatile memory is again divided into a dynamic random access memory (hereinafter referred to as "DRAM") and a static DRAM (hereinafter referred to as "SDRAM"). One characteristic of the volatile memory is that data are maintained just while power is being applied. In other words, when power is cut, the data in the volatile memory disappear. On the other hand, the non-volatile memory, mainly a ROM (Read Only Memory), can keep the data regardless of power being applied thereto.

From the point of a view of the fabrication process, the non-volatile memory is divided into a floating gate type and a metal insulator semiconductor (hereinafter referred to as "MIS") type. The MIS type has doubly or triply deposited dielectric layers which comprise at least two kinds of dielectric materials.

The floating gate type implements the memorizing characteristic using potential wells and, recently, an ETOX (Electrically erasable programmable read only memory Tunnel OXide) used in a flash EEPROM (Electrically Erasable Programmable Read Only Memory) is a well-known structure.

Alternatively, the MIS type performs the program/erase operation using traps at dielectric layer bulk, interface between dielectric layers, and interface between dielectric layer and a semiconductor. A metal/silicon ONO Semiconductor (hereinafter referred to as "MONOS/SONOS") structure mainly used to the flash EEPROM is a representative structure.

A Conventional SONOS memory device comprises a tunnel oxide layer, a trap nitride layer and a block oxide layer on a P-type silicon substrate, and a gate deposited thereon.

In the SONOS memory device, a program operation is performed by FN-tunneling or directly tunneling electrons so that the electrons are trapped at a predetermined site in the trap nitride layer, thereby increasing a threshold voltage. An erase operation moves the electrons by various tunneling ways such as the FN-tunneling, the direct tunneling, and a trap assisted tunneling so that the electrons are withdrawn from the P-type silicon substrate, thereby decreasing the threshold voltage.

Because the conventional SONOS device has employed the tunneling method for the program/erases operation as described above, the thickness of the tunnel oxide has to be at most about 20 Å to achieve adequate program/erase operating speed. However, the thinness of the tunnel oxide (e.g., 20 Å) may detrimentally affect the retention characteristic of the memory device. Thus, various methods have been provided to solve such a problem in the SONOS device. One known method is to thicken the tunnel oxide layer and employ a thermal electron injection to perform the program operation and a hot hole injection to conduct the erase operation, thereby improving the retention characteristic. However, the above-described method radically deteriorates the endurance characteristic of the SONOS device.

Figure 1:
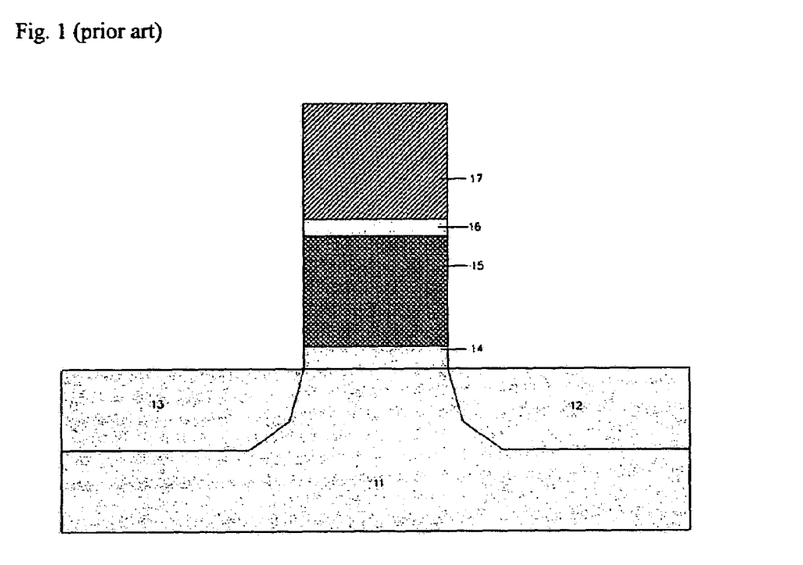
FIG. 1 is a cross-sectional view illustrating a floating gate of a conventional single bit stack gate type.

FIG. 1 is a cross-sectional view illustrating a floating gate of a conventional single bit stack gate type.

Referring to FIG. 1, a tunneling oxide layer comprising an $SiO_2$ layer 14 is formed on a P-type silicon substrate 11. A polysilicon floating gate 15 is formed on the tunneling oxide layer of the resulting structure. An oxide-nitride-oxide (hereinafter referred to as "ONO") layer 16 is formed to increase the coupling ratio. A control gate 17 is formed on the ONO layer 16. A source 13 and drain 12 are then made adjacent to each side of bottom of the $SiO_2$ layer 14.

Figure 2:
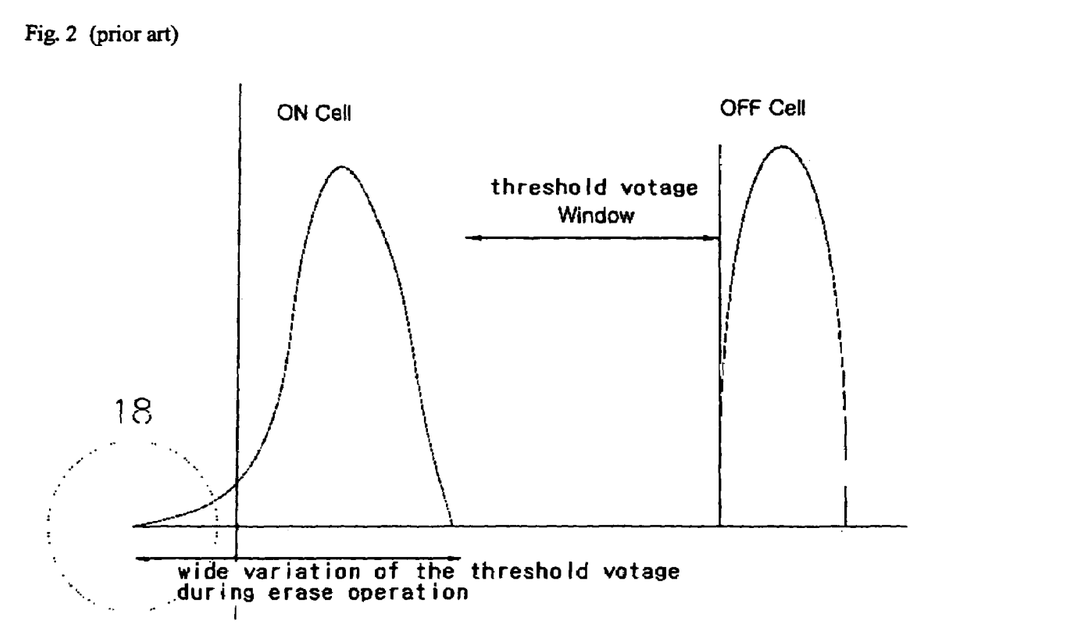
FIG. 2 represents a graph illustrating the distribution of the threshold voltage of the program/erase operation of the floating gate of a conventional single bit stack gate type.

FIG. 2 represents a graph illustrating the distribution of the threshold voltage of the program/erase operation of the floating gate of a conventional single bit stack gate type.

Referring to FIG. 2, the threshold voltage of a cell 18 can become under 0[V] by an over-erase during the erase operation. In that case, the threshold distribution of the erase operation is higher than that of the program operation to thereby decrease a threshold window. In other words, only one over-erased cell in the bit line may induct excessive current into the bit line and, therefore, interrupt to read data of other cells along the bit line. Such the over-erase may be caused by various structural problems such as a critical dimension in the cell of the flash memory, the thickness of the tunneling oxide layer, a junction overlap, the critical dimension of the floating gate, uniformity of the floating gate, the thickness of the ONO layer, the damage of the tunneling oxide layer, and pin holes. A well-known conventional method for solving the over-erase problem comprises steps of: detecting over-erased cell; and reprogramming the detected over-erased cell in order to increase the threshold voltage thereof.

However, the step of detecting the over-erased cell is a time-consuming job and, additionally, complicated circuits are required to recover the detected over-erased cell. Moreover, the threshold voltage distribution during the erase operation is high and affects the threshold voltage distribution of a later program operation. Consequently, the threshold window voltage decreases and a multi-level bit is hardly achieved in accordance with the conventional art methods.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE PREFERRED EMBODIMENT

A primary object of the present invention is to efficiently and effectively perform program/erase operations with a device having a sidewall floating gate which can control two bits with only one transistor.

To achieve these objects and other advantages and in accordance with the purpose of the invention, as embodied and broadly described herein, the present invention provides a non-volatile memory device having a unit cell comprising: a transistor including a polysilicon gate, sidewall floating gates, a block oxide layer and a source/drain region; a word lines vertically placed on a substrate and connected to the polysilicon gate; a first bit line orthogonally placed to the word lines and connected to the source region; and a second bit line orthogonally placed to the word lines and connected to the drain region.

Figure 3:
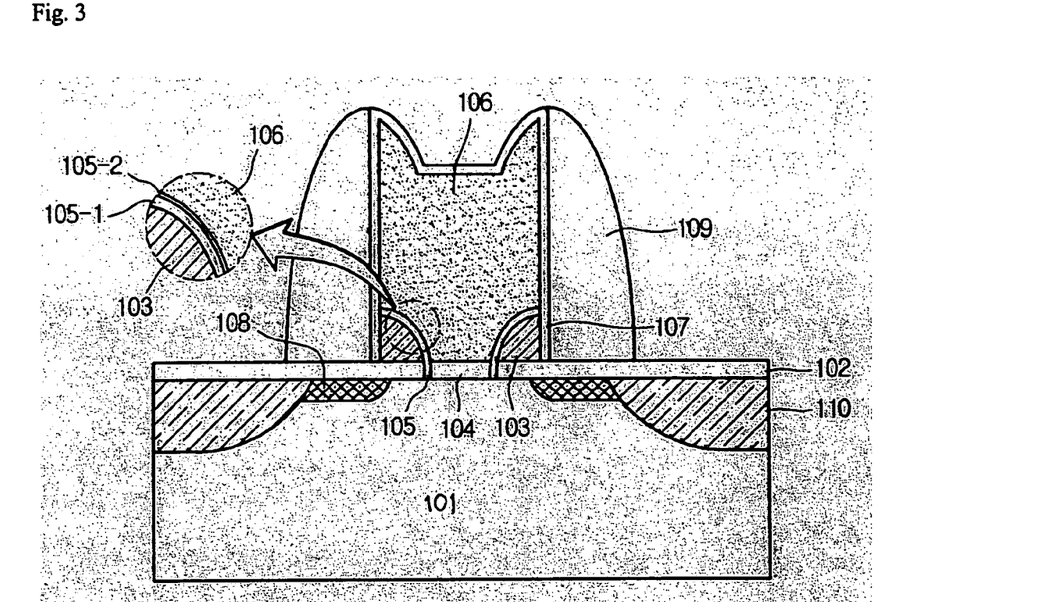
FIG. 3 is a cross-sectional view illustrating a volatile memory device having a sidewall floating gate which can control two bits with one transistor in accordance with the present invention.

FIG. 3 is a cross-sectional view representing a volatile memory device having a sidewall floating gate cross sectional two bits with one transistor in accordance with the present invention.

Referring to FIG. 3, a gate oxide layer 104 is positioned on a semiconductor substrate 101. A polysilicon gate 106 is positioned on the gate oxide layer 104. Sidewall floating gates 103 are deposed in the bottom of the lateral faces of the polysilicon gate 106. Block oxide layers 105 are placed between the polysilicon gate 106 and the sidewall floating gates 103. A tunnel oxide layer 102 is positioned between the sidewall floating gates 103 and the semiconductor substrate 101. Sidewall spacers 109 are disposed between the polysilicon gate 106 and the lateral face of the sidewall floating gates 103. Source/drain region 110 is positioned adjacent to a source/drain extension region 108. The polysilicon gate 106 may be a 'T' shaped gate electrode, which means that the upper part of the polysilicon gate 106 (i.e., farthest away from the substrate) is larger in width than the lower part of the polysilicon gate 106 (i.e., closest to the substrate). In addition, a polysilicon oxide layer 107 is formed between the sidewall spacers 109 and the polysilicon gate 106, between the sidewall spacers 109 and the sidewall floating gates 103, and directly on top of the polysilicon gate 106.

The block oxide layers 105 comprise a first block oxide layer 105-1 and a second block oxide layer 105-2. The first block oxide layer 105-1 has a thickness ranging between 50 Å and 250 Å and comprises a material selected from the group consisting of $Al_2O_3$ and $Y_2O_3$. The second block oxide layer 105-2 has a thickness ranging between 20 Å and 150 Å and comprises $SiO_2$.

According to FIG. 3, one transistor is capable of controlling two bits by changing potential walls of the surface of the semiconductor substrate 101 under the sidewall floating gates 103 by means of injecting/withdrawing into/from the sidewall floating gates 103.

The use of the first block oxide layer 105-1 and the second block oxide layer 105-2 instead of the conventional ONO layer for the floating gate device compensates for escape of electrons from the polysilicon 106 into the P-type substrate (or source/drain) through the sidewall floating gates 103 by MFN tunneling or for injection of holes from the P-type substrate (or source/drain) into the sidewall floating gates 103 at the late stage of erase. Consequently, the convergence of the threshold voltage of the erase state to a predetermined value prevents over-erase operation. A narrow distribution of the threshold voltage of the erase state not only prevents shrinkage of the threshold voltage window due to wide distribution of the threshold voltage, but makes the erase threshold voltage to have a narrow width at a predetermined voltage level. Furthermore, the threshold voltage distribution of a program state also becomes narrow, so that the embodiment of multi-level bit cell gets easier.

Figure 4:
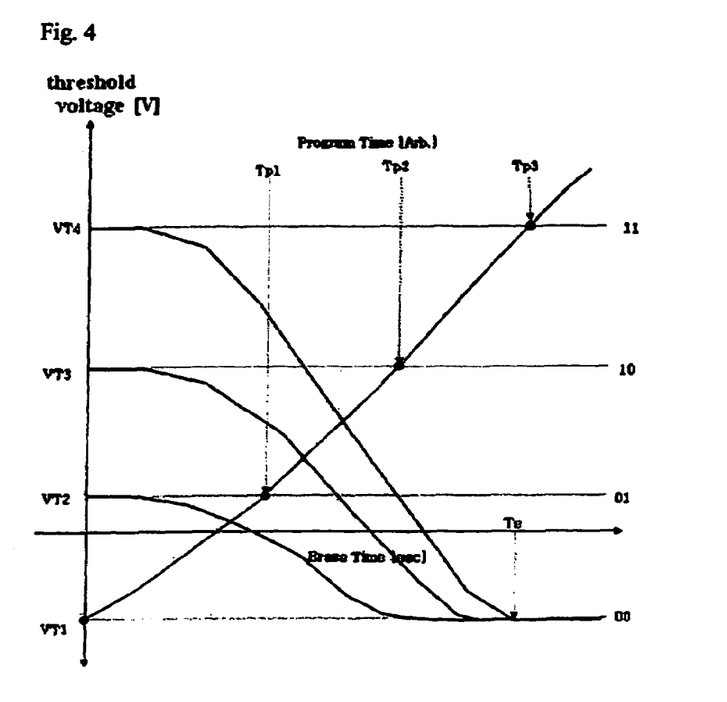
FIG. 4 represents a graph illustrating the characteristic of the program/erase operation of the non-volatile memory in accordance with the present invention.

FIG. 4 represents a graph illustrating the characteristic of the program/erase operation of the non-volatile memory in accordance with the present invention.

Referring to the threshold voltage of "00" state as VT1, the threshold voltage of "01" state as VT2, the threshold voltage of "10" state as VT3, and the threshold voltage of "11" state as VT4. In case of erasing the programmed cells, whatever state the cells are programmed, as the threshold voltage of erase converges to VT1 when the erase operation is performed over Te second.

Considering the programming of the erased cells to the state of "00", "01", "10", and "11", respectively, the cells to be "00" state need not be manipulated. The cells for "01"/"10"/"11" state are programmed for Tp1/Tp2/Tp3 seconds respectively. The narrow distribution of the threshold voltage of the programmed cells also makes the threshold voltage distribution of the erase state very narrow. Therefore, the window margin of the threshold voltage is enhanced.

Figure 5:
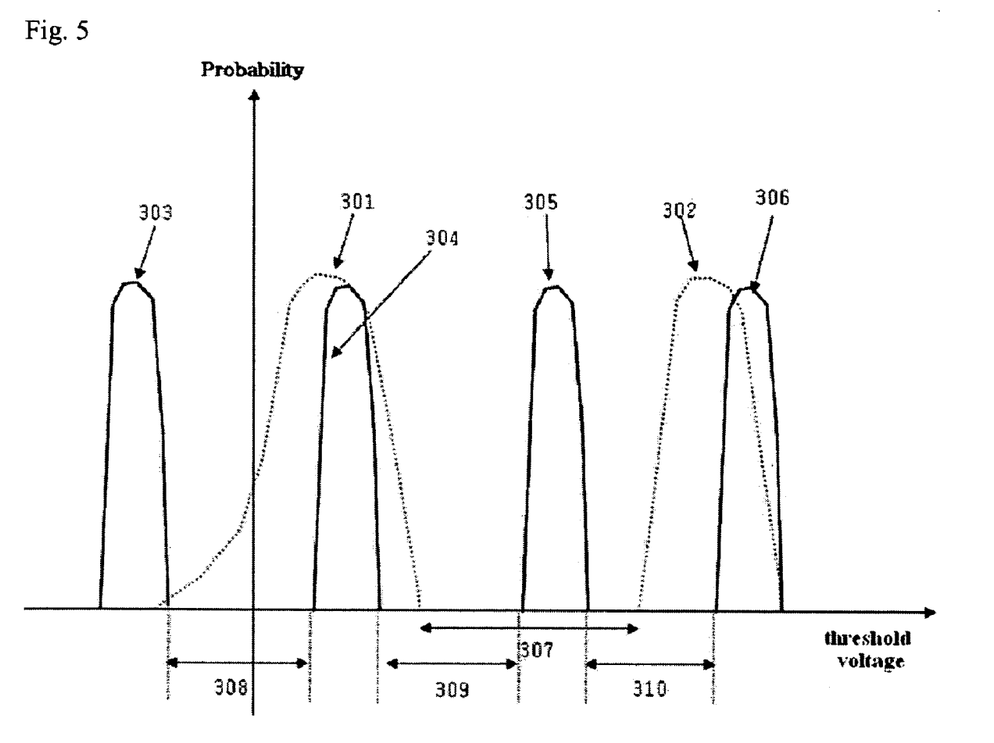
FIG. 5 represents a graph illustrating the threshold voltage distribution of the non-volatile memory with multi-level bits in accordance with the present invention.

FIG. 5 represents a graph illustrating the threshold voltage distribution of the non-volatile memory with multi-level bits in accordance with the present invention.

The threshold voltages of the erase state 301 and the program state 302 are shown for the conventional floating gate device. The wide threshold voltage distribution of the erase state affects the program state and the threshold voltage distribution of the program state is also spread widely. That is, the window margin of the threshold voltage distribution between the program state and the erase state gets very narrow. Thus, it is very hard to apply the multi-level bit technology by using the conventional floating gate device.

For the non-volatile memory device according to the present invention that has the feature of self-convergence erase, the threshold voltage distribution of the erase state becomes very narrow feature by the self-convergence feature of erase threshold voltage as illustrated by 303. The threshold voltage of the erase state influences on the threshold voltage distribution of the program state so that the threshold voltage distributions of "01"(304)/ "10"(305)/ "11"(306) state become narrow. In consequence, the use of the non-volatile memory device with the feature of self-convergence erase facilitates the adoption of the multi-level bit technology because of the wide range of threshold voltage window 308, 309 and 310.

Figure 6:
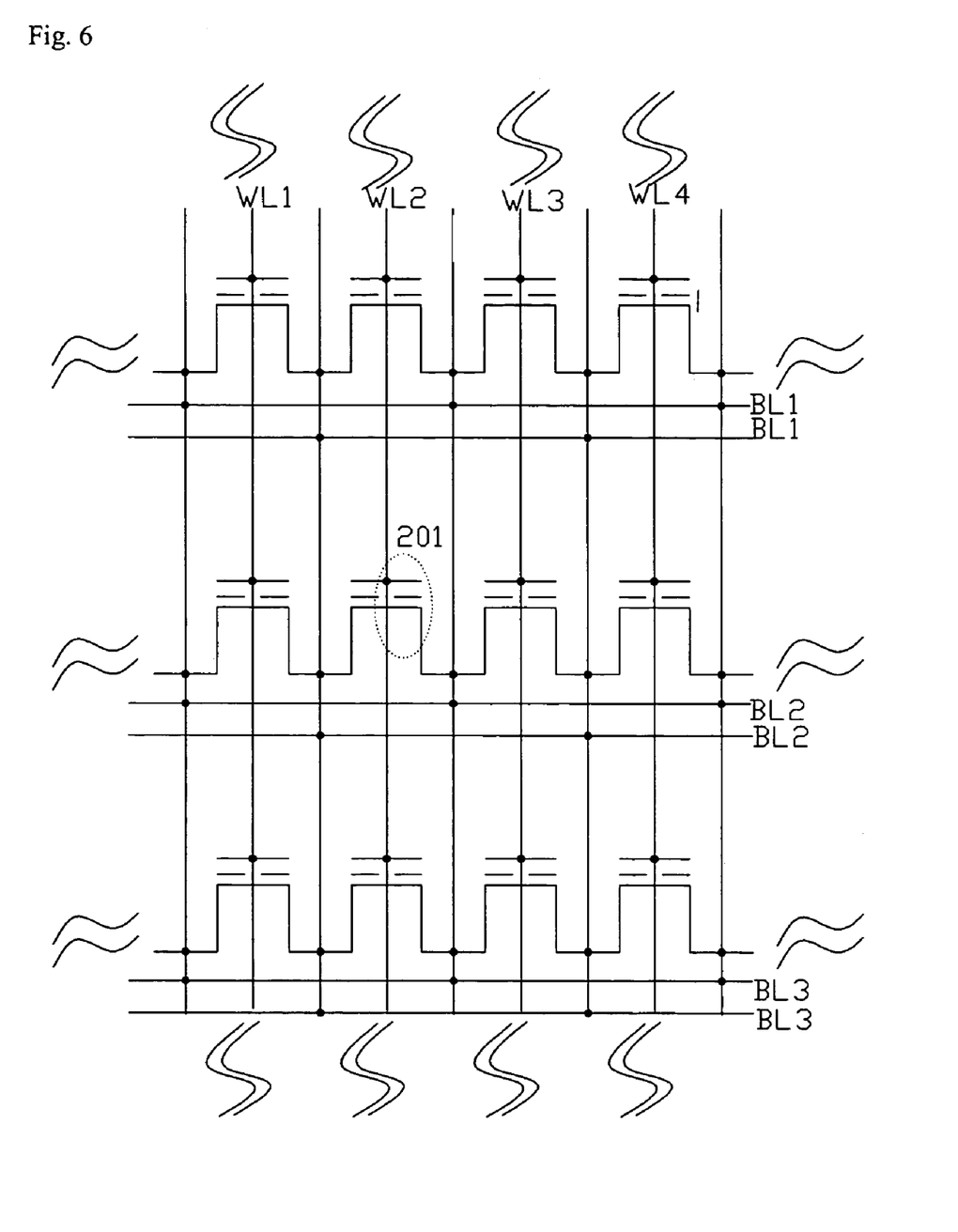
FIG. 6 is a non-volatile NOR memory cell array with multi-level bit using the non-volatile memory in accordance with the present invention.

FIG. 6 is a non-volatile NOR cell array with multi-level bit using the non-volatile memory in accordance with the present invention.

Referring to FIG. 6, a unit cell of the NOR flash array comprises transistors, word lines and bit lines. Each of the transistors includes a polysilicon gate, sidewall floating gates, a block oxide layer and a source/drain region. The word lines are connected to the polysilicon gate and horizontally placed on a substrate. The bit lines includes the first/second bit lines vertically placed to the word lines and connected to the source/drain region.

Table 1 illustrates the voltage applied to the word lines, the bit lines and a body of the two bit sidewall floating gate 201 for selectively performing program, read, and erase operations in block level.

(or source/drain) into the sidewall floating gates at the late stage of erase. Accordingly, the threshold voltage of the erase state converges to a predetermined value.

Next, a selective program operation is performed under a bias condition where Vwlp is applied to just WL2 in the word lines, 0[V] is applied to the rest of the word lines (WL1, WL3 and WL4), Vblp[V] is applied to the BL2 and 0[V] is applied to the rest of the bit lines (BL1, BL1', BL2',

TABLE 1

|        | WL1   | WL2   | WL3   | WL4   | BL1  | BL1' | BL2  | BL2' | BL3  | BL3' | Body |
|--------|-------|-------|-------|-------|------|------|------|------|------|------|------|
| Erase1 | −Vwle | −Vwle | −Vwle | −Vwle | F    | F    | F    | F    | F    | F    | 0/Vb |
| Erase2 | −Vwle | −Vwle | −Vwle | −Vwle | 0/Ve | 0/Ve | 0/Ve | 0/Ve | 0/Ve | 0/Ve | F    |
| Program| 0     | −Vwlp | 0     | 0     | 0    | 0    | Vblp | 0    | 0    | 0    | 0    |
| Read   | 0     | Vref  | 0     | 0     | 0    | 0    | 0    | Vblr | 0    | 0    | 0    |

Referring to Table 1, the erase operation in block level can be performed by two ways. One is to move electrons from the sidewall floating gate toward the channel by the F/N-tunneling the electrons. The other is to carry electrons from the sidewall floating gate toward the source/drain region by the F/N-tunneling.

In Table 1, Erase1 is performed under a bias condition where electrons are moved from the sidewall floating gate toward the channel by the F/N-tunneling. In detail, −Vwle [V] is applied to the word lines (WL1, WL2, WL3, WL4), 0[V] or Vb[V] is applied to the body and the bit lines (BL1, BL1', BL2, BL2', BL3, BL3') are floated to perform the Erase1. Therefore, Erase1 applies a strong electric field from the channel toward the sidewall floating gate, resulting in moving the electrons trapped in the potential well toward the substrate through the F/N-tunneling, thereby decreasing the threshold voltage. During this situation, because another strong electric field can be applied from the channel toward the word lines (polysilicon gate), an adequate bias condition for performing Erase1 should be defined to prevent the occurrence of breakdown from the channel to the word lines during the F/N-tunneling.

The structure of the first block oxide layer and the second block oxide layer has a following advantage. That is, it compensates for escape of the electrons from the polysilicon 106 into the P-type substrate (or source/drain) through the sidewall floating gates by MFN tunneling or for injection of holes from the P-type substrate (or source/drain) into the sidewall floating gates at the late stage of erase. Accordingly, the threshold voltage of the erase state converges to a predetermined value.

Erase2 is conducted under a bias condition where electrons are moved from the sidewall floating gates toward the source/drain region through the F/N-tunneling. −Vwle[V] is applied to the word lines (WL1, WL2, WL3, WL4), 0[V] or Vs[V] is applied to the bit lines (BL1, BL1', BL2, BL2', BL3, BL3') and the body is floated to conduct the Erase2. Thus, a strong electric field is applied from the source/drain region to the sidewall floating gates, leading to moving electrons in the potential wall of the sidewall floating gates to the source by the F/N tunneling. As a result, the erase operation decreasing the threshold voltage is then achieved. During this situation, the breakdown is not a serious consideration because a strong electric field from the channel to the polysilicon gate does not appear during the erase operation. As mentioned above, the structure of the first block oxide layer and the second block oxide layer has a following advantage. That is, it compensates for escape of the electrons from the polysilicon 106 into the P-type substrate (or source/drain) through the sidewall floating gates by MFN tunneling or for injection of holes from the P-type substrate BL3, BL3'), and 0[V] is applied to the body. Under the condition described above, a bit line voltage is applied to all drains contacted with BL2 and a voltage is applied to the word lines (polysilicon gate) for the device along the WL2. Thus, a voltage is applied to the drain and the gate of sidewall floating gates device of the cell 201 and a current from the source to the drain. When the current flows from the source to the drain, an electric field is strongest in the region including the cell 201 and the electrons in the channel are then readily converted into heat electrons. The heat electrons are then injected into the potential wells formed in the sidewall floating gates of the cell 201 by an vertical field, thereby achieving the program operation increasing the threshold voltage. Here, the optimum conditions for the Vblp and Vwlp which are applied to the bit lines and the word lines are determined in consideration of several factors such as hot electron injection efficiency, drain junction breakdown, gate disturbance, program current, and threshold voltage of select transistor. The erased cells of "00" state can also be adjusted to "01", "10", or "11" by controlling program time.

Next, a read operation is performed under a bias condition where Vref reference is applied to the WL2, Vblr is applied to BL2', and 0[V] is applied to the rest of the word lines (WL1, WL3, WL4) and bit lines (BL1, BL1', BL2, BL3, BL3') and the body. Under the read bias condition described above, if the threshold voltage of the cell 201 is lower than Vref, a current may flow from BL2'(drain) to BL2(source) with being regarded as an erase state. On the contrary, if the threshold voltage of the cell 201 is higher than Vref, a current may not flow from BL2'(drain) to BL2(source). Thus, program/erase state can be detected by the current flow. Here, the state of each cell is detected by adjusting Vref which is applied to the word lines. For example, referring to Vref1 as a middle voltage between a maximum threshold voltage of "00" state and a minimum threshold voltage of "01" state, and Vref2 as a middle voltage between a maximum threshold voltage of "01" state and a minimum threshold voltage of "10" state, and Vref3 as a middle voltage between a maximum threshold voltage of "10" state and a minimum threshold voltage of "11" state, a read operation is conducted as follows. First, it is detected whether the current flow from BL2'(drain) to BL2(source) by applying Vref1 to the word lines. If the current flows from BL2'(drain) to BL2(source), the read operation is ended by regarding the cell state as "00". If the current is not detected, then it is detected whether the current flows from BL2'(drain) to BL2(source) by applying Vref2 to the word lines. If the current flows from BL2'(drain) to BL2(source), the read operation is ended by regarding the cell state as "01". Otherwise, detect whether the current flow from BL2'(drain) to BL2(source) by applying Vref3 to the word lines. If the current is flowed from BL2'(drain) to BL2(source), the cell state is regarded as "10", otherwise all the read operation is ended by regarding the cell state as "11". If the voltage applied to the word lines is too high during the read operation, the program operation can be started for the cell to read. Thus, an appropriately low voltage has to be applied to prevent the unintentional program operation.

Figure 7:
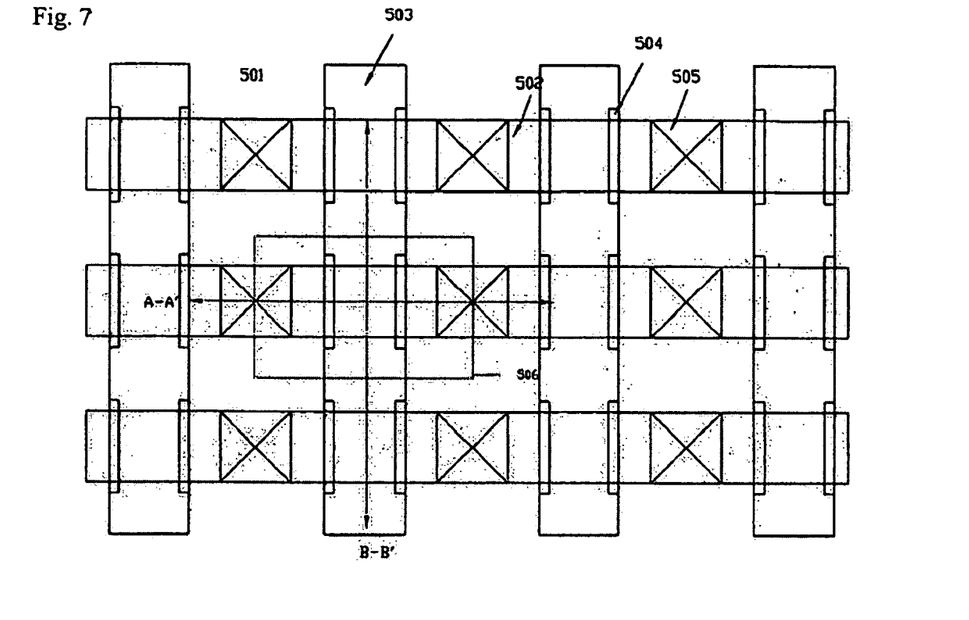
FIG. 7 is the layout of the NOR flash array in the non-volatile memory device.

FIG. 7 is the layout of the NOR flash array in the non-volatile memory device.

A pair of active regions 501, at least, is vertically and horizontally placed on a semiconductor substrate. The active regions are separated by isolation structures 502. Several word lines (polysilicon gate) 503 are horizontally positioned across the top of the vertically placed active regions. Source/drains regions are orthogonally positioned to the word lines and placed across the top of the horizontally placed active regions. Bit line contacts 505 are positioned in the source/drain regions. Sidewall floating gates 504 are positioned in the word lines adjacent to the source/drain regions.

Figure 8:
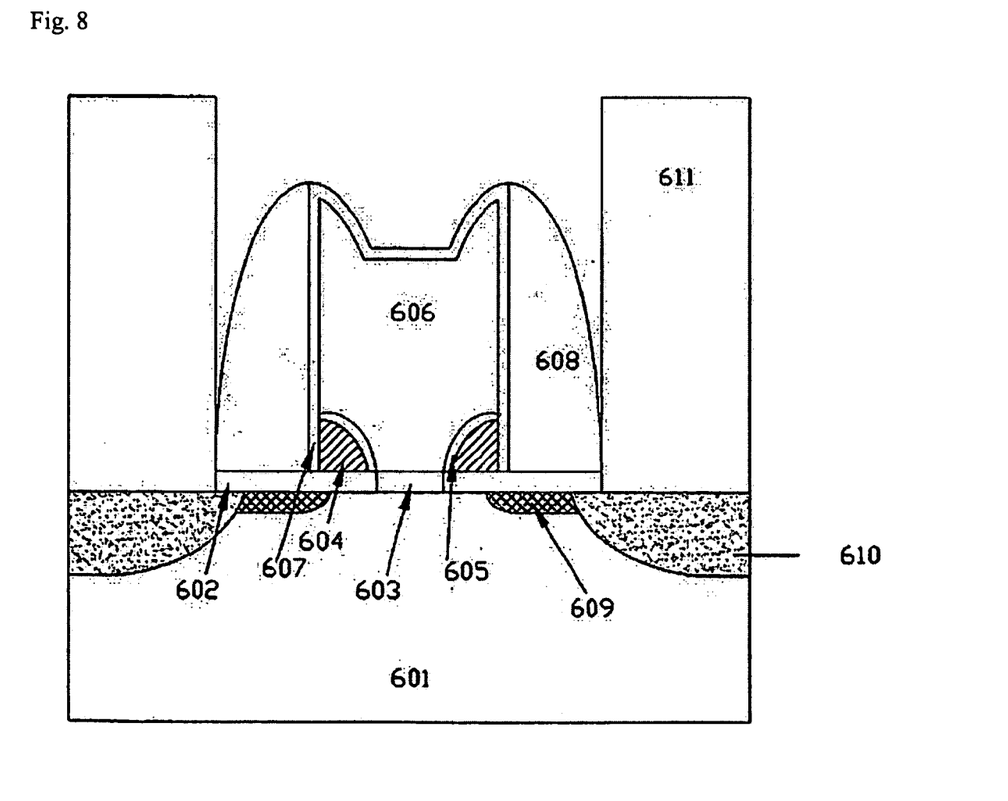
FIG. 8 is a cross-sectional view illustrating of the unit cell 506 along the line A–A' in FIG. 7.

FIG. 8 is a cross-sectional view illustrating of the unit cell 506 along the line A–A' in FIG. 7.

Referring to FIG. 8, a polysilicon gate 606, the word lines, is positioned over the active region 601. Two sidewall floating gates 604 are placed facing each other on the active region. A gate oxide layer 603 is placed between the word lines and the active region. A tunneling oxide layer 602 is disposed between the sidewall floating gates and the active region. Block oxide layers 605 are disposed between the sidewall floating gates and the polysilicon gate. The block oxide layers comprise a first block oxide layers and a second block oxide layers. Sidewall spacers 608 are positioned on the sidewalls of the polysilicon gate and the sidewall floating gates, and a poly oxide layer 607 is positioned therebetween. Source/drain extension regions 609 are positioned under the sidewall spacers. Source/drain regions 610 are positioned adjacent to the source/drain extension region. Bit line contacts for bit lines 611 are placed on the source/drain regions.

Figure 9:
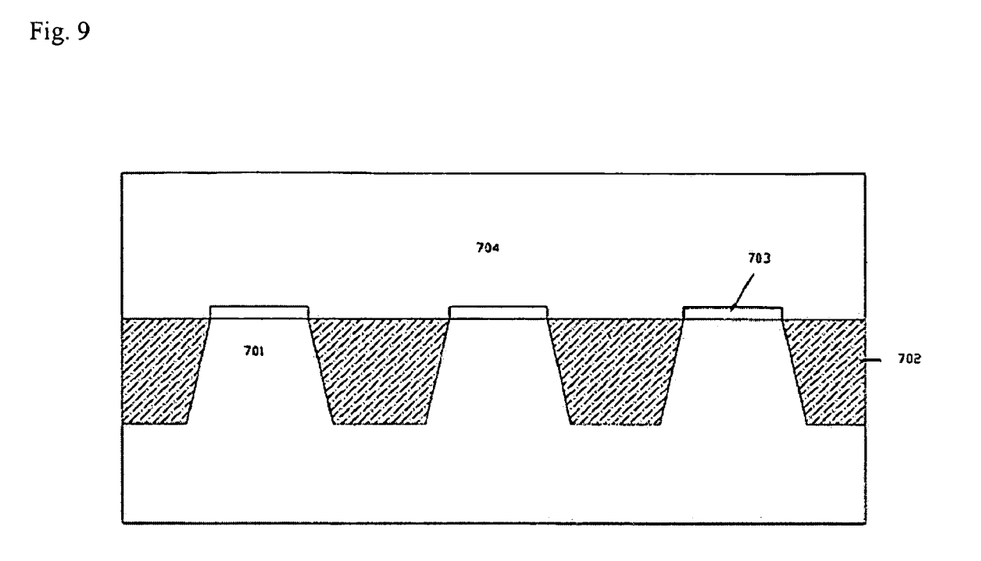
FIG. 9 is a cross-sectional view illustrating of the unit cell 506 along the line B–B' in FIG. 7.

FIG. 9 is a cross-sectional view illustrating of the unit cell 506 along the line B–B' in FIG. 7.

Referring to FIG. 9, active regions 701 are separated by isolation structures 702. Word lines 704 are positioned on the active regions 701. Gate oxide layers 703 are formed between the active region 701 and the word lines 704.

According to the two-bit sidewall floating gates device described above, the present invention provides a NOR flash cell array having one transistor which can control two bits. In addition, the first block oxide layer and the second block oxide layer are used instead of an ONO layer of the floating gates device in the prior art.

It compensates for escape of the electrons from the polysilicon 106 into the P-type substrate (or source/drain) through the sidewall floating gates by MFN tunneling or for injection of holes from the P-type substrate (or source/drain) into the sidewall floating gates at the late stage of erase. Accordingly, the threshold voltage of the erase state converges to a predetermined value. The narrow distribution of the erase threshold voltage can also improve the reduced threshold voltage window which arises from the wide distribution of the erase threshold voltage.

Consequently, by using the non-volatile memory device of the two bit sidewall floating gates having self-convergence erase feature, the threshold voltage can have a narrow width at a predetermined voltage level. In addition, the NOR flash cell region according to the present invention may be decreased by ¼ compared to the region of the conventional NOR flash cell array which uses one transistor for 4 bits.

Each of the bit states, that is "00", "01", "10" and "11" state, has such a narrow distribution of the threshold voltage is so narrow that the read operation may be proceeded without an error. The leakage current which flows to unselected cell may be decreased during the program, so a program, current can be effectively reduced and a charge pump circuit and chip size may be then downsized. Moreover, the threshold voltage window can be made wider by means of making the erase threshold voltage negative.

Although certain example methods, apparatus and articles of manufacture have been described herein, the scope of coverage of this patent is not limited thereto. On the contrary, this patent covers all methods, apparatus and articles of manufacture fairly falling within the scope of the appended claims either literally or under the doctrine of equivalents.

What is claimed is:

1. A non-volatile memory device having a unit cell, the unit cell comprising:
   a transistor including:
      a gate oxide layer on a substrate;
      a polysilicon gate having lateral faces;
      sidewall floating gates having lateral faces;
      block oxide layers formed between the polysilicon gate and sidewall floating gates, the block oxide layers comprising a first block oxide layer and a second block oxide layer on the first block oxide layer;
      sidewall spacers formed on the lateral faces of the polysilicon gate and the lateral faces of the sidewall floating gates;
      a polysilicon oxide layer formed between polysilicon gate and the sidewall floating gates and the sidewall spacers, and over a top surface of the polysilicon gate; and
      source and drain regions;
   a plurality of word lines vertically placed on the substrate and connected to the polysilicon gate;
   a first bit line orthogonally placed to the word lines and connected to the source region; and
   a second bit line orthogonally placed to the word lines and connected to the drain region.

2. The device as defined by claim 1, wherein the source region and the first bit line are connected by a bit line contact.

3. The device as defined by claim 1, wherein the drain region and the second bit line are connected by a bit line contact.

4. The device as defined by claim 1, wherein the polysilicon gate is a 'T' shaped gate, which means that the upper part of the polysilicon gate is larger in width than the lower part of the polysilicon gate.

5. The device as defined by claim 1, wherein the first block oxide layer has a thickness ranging between 50 Å and 250 Å and comprises a material selected from the group consisting of $Al_2O_3$ and $Y_2O_3$.

6. The device as defined by claim 1, wherein the second block oxide layer has a thickness ranging between 20 Å and 150 Å and comprises a $SiO_2$.

7. The device as defined by claim 1, wherein a threshold voltage of the sidewall floating gate decreases as an erase operation time increases and converges to a predetermined threshold voltage at the end of the erase operation.

* * * * *